US006966046B2

(12) United States Patent
Curran et al.

(10) Patent No.: US 6,966,046 B2
(45) Date of Patent: Nov. 15, 2005

(54) CMOS TAPERED GATE AND SYNTHESIS METHOD

(75) Inventors: Brian W. Curran, Saugerties, NY (US); Lisa Bryant Lacey, Clinton Corners, NY (US); Gregory A. Northrop, Putnam Valley, NY (US); Ruchir Puri, New Rochelle, NY (US); Leon Stok, Croton-on-Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 831 days.

(21) Appl. No.: 09/841,505

(22) Filed: Apr. 24, 2001

(65) Prior Publication Data

US 2002/0157079 A1 Oct. 24, 2002

(51) Int. Cl.[7] .................................... G06F 17/50
(52) U.S. Cl. .................................... 716/18; 716/6
(58) Field of Search .................................... 716/18, 1, 6

(56) References Cited

U.S. PATENT DOCUMENTS 4,827,428 A * 5/1989 Dunlop et al. .................. 716/6
5,168,455 A * 12/1992 Hooper .................. 716/18
5,654,898 A * 8/1997 Roetcisoender et al. ....... 716/9
5,724,250 A * 3/1998 Kerzman et al. .............. 716/3
6,192,508 B1 * 2/2001 Malik et al. .................. 716/9
6,397,169 B1 * 5/2002 Shenoy et al. ................ 703/14
2001/0049814 A1 * 12/2001 Matsumoto et al. .......... 716/10

OTHER PUBLICATIONS

Hwang, W. et al., "Performance Analysis of Tapered Gate in PD/SOI CMOS Technology", Proceedings of Technical Papers, 2001 International Symposium on VLSI Technology, Systema and Applications, Apr. 18–20, 2001, pp. 287–290.*

* cited by examiner

*Primary Examiner*—A. M. Thompson
*Assistant Examiner*—Magid Y. Dimyan
(74) *Attorney, Agent, or Firm*—Lynn L. Augspurger

(57) ABSTRACT

A high-performance gate library is augmented with tapered gates. The widths of the stacked devices are varied to reduce the delay through some of the input pins. For example in a tapered NAND gate the bottom devices in the NFET stack are have longer widths than the top device to achieve smaller top input to output pin delay at the expense of larger bottom input to output pin delay. The method of using synthesis algorithms modifies the input net to gate pin connections and swaps traditional non-tapered gates with tapered gates to improve the delay of the timing critical paths. The latest arriving gate input net is swapped with the net connected to the top pin. The gate is then converted to a tapered gate provided the paths through the bottom gate input(s) that are not timing critical.

8 Claims, 6 Drawing Sheets

Start
Select next timing critical gate G (60)
none left → Done
G = inverter ? (61) Y / N
Is most timing critical net attached to A pin ? (62) N / Y
Swap most-timing critical net to pin A (63)
Replace G with next functionally-equivalent tapered gate G' (64) none left
Run timing analysis (65)
Did timing improve ? (66) N / Y
Swap G' back to G (67)

Synthesis tapered algorithm

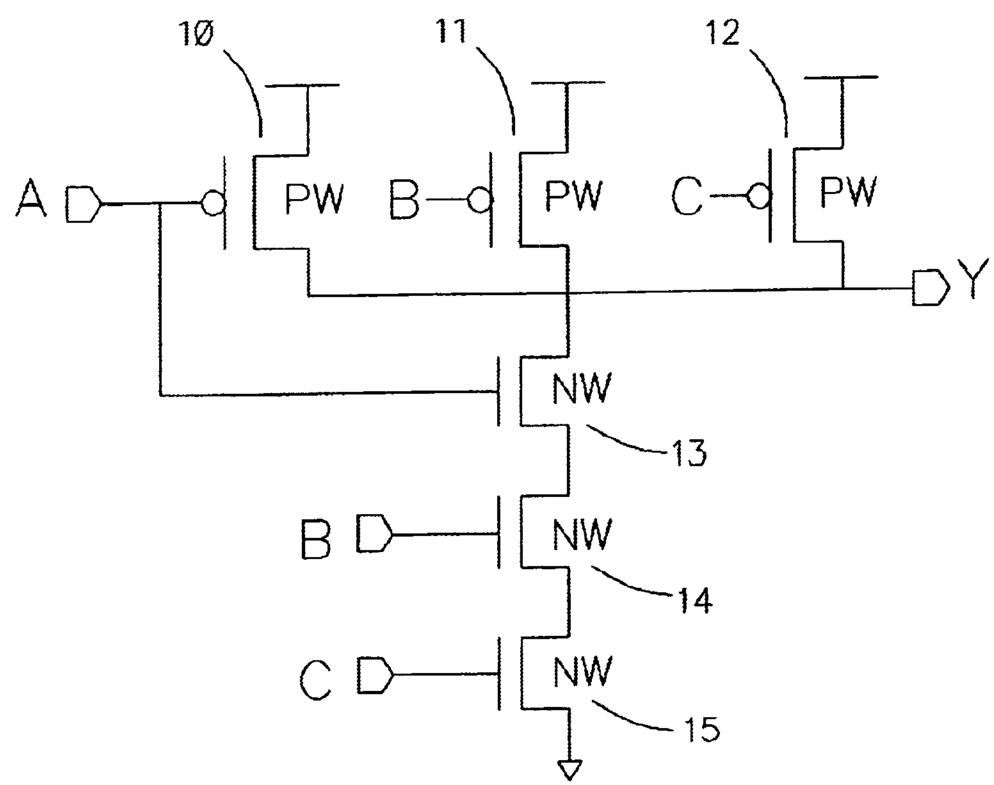
Fig 1. Non-tapered 3-input CMOS NAND gate

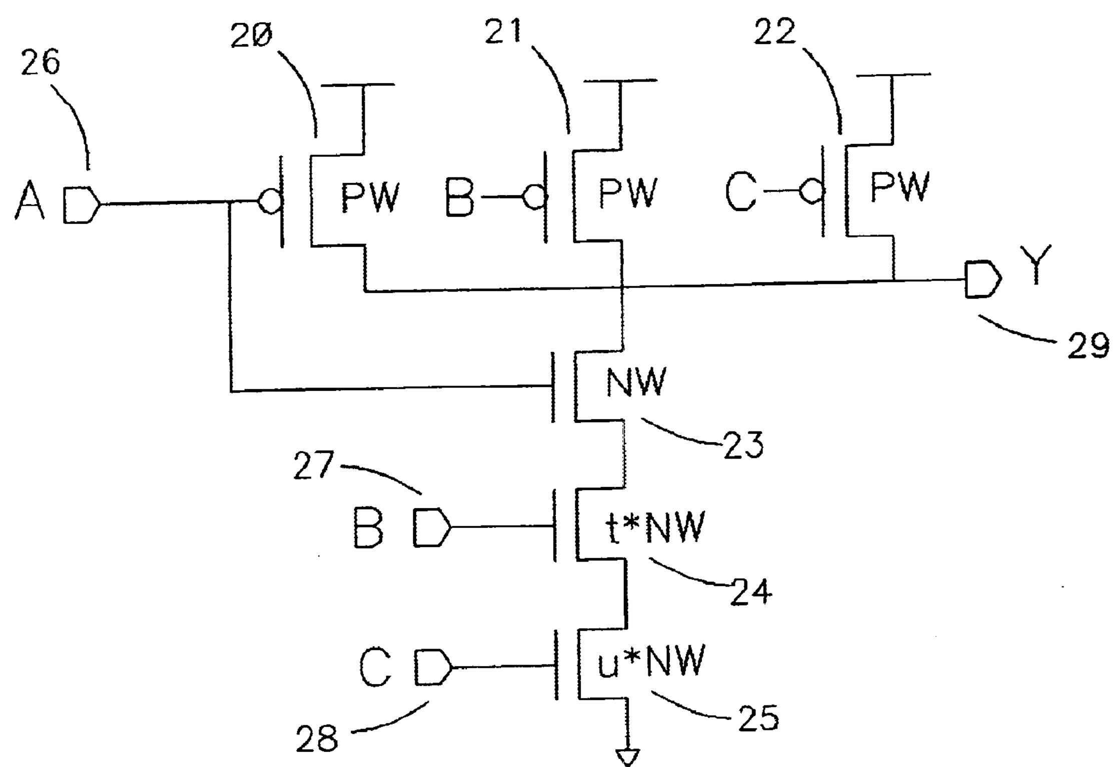
Fig 2. Tapered 3-input CMOS NAND gate

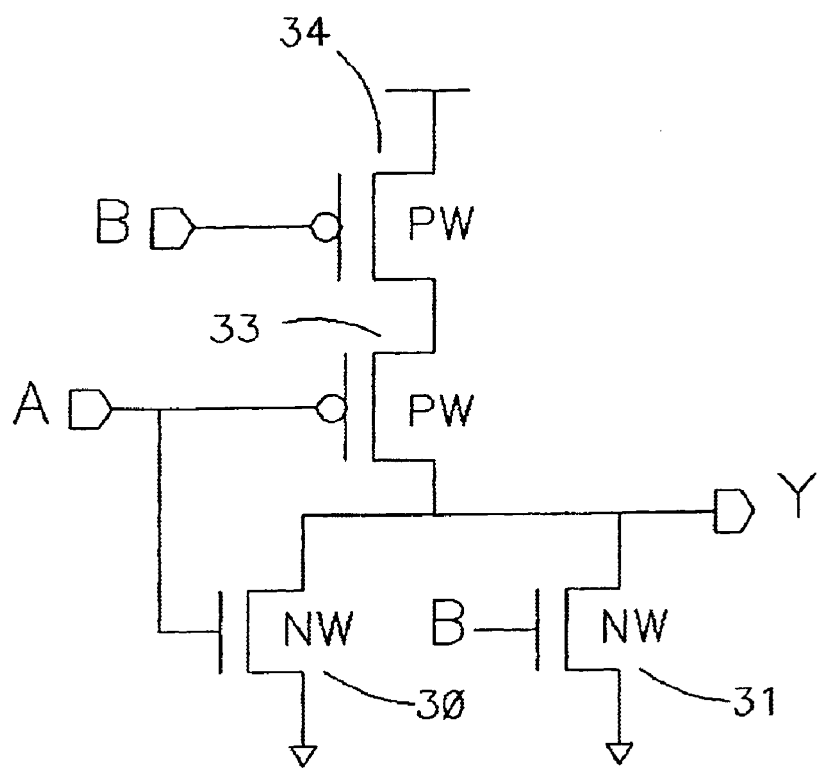
Fig 3. Non-tapered 2-input CMOS NOR gate

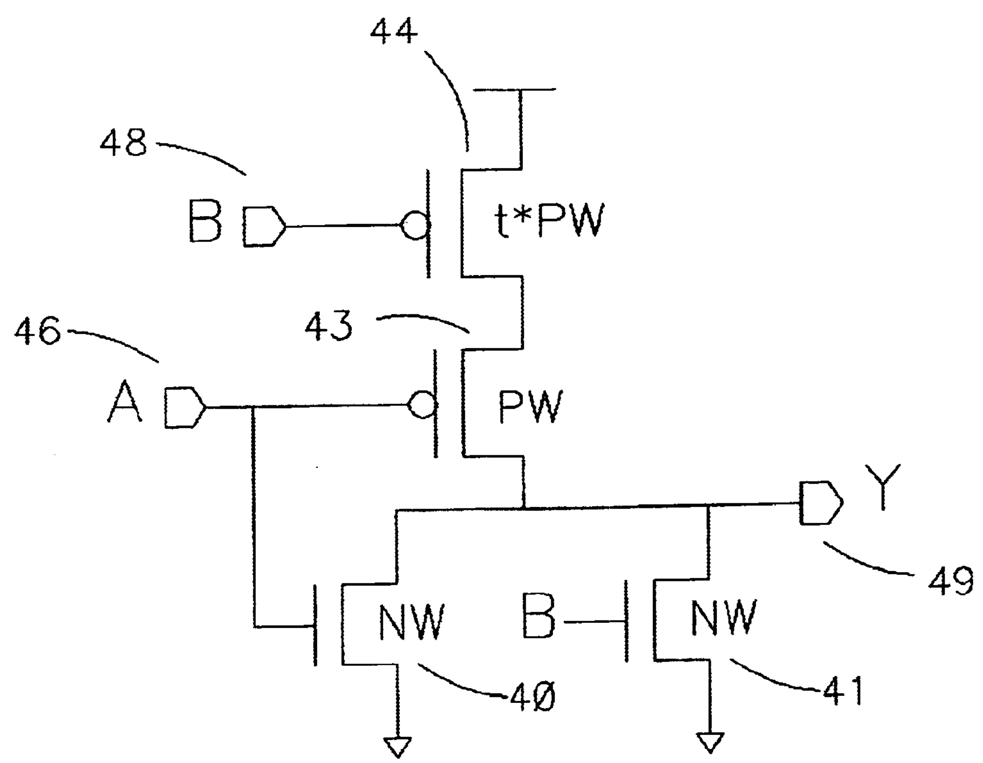
Fig 4. Tapered 2-input CMOS NOR gate

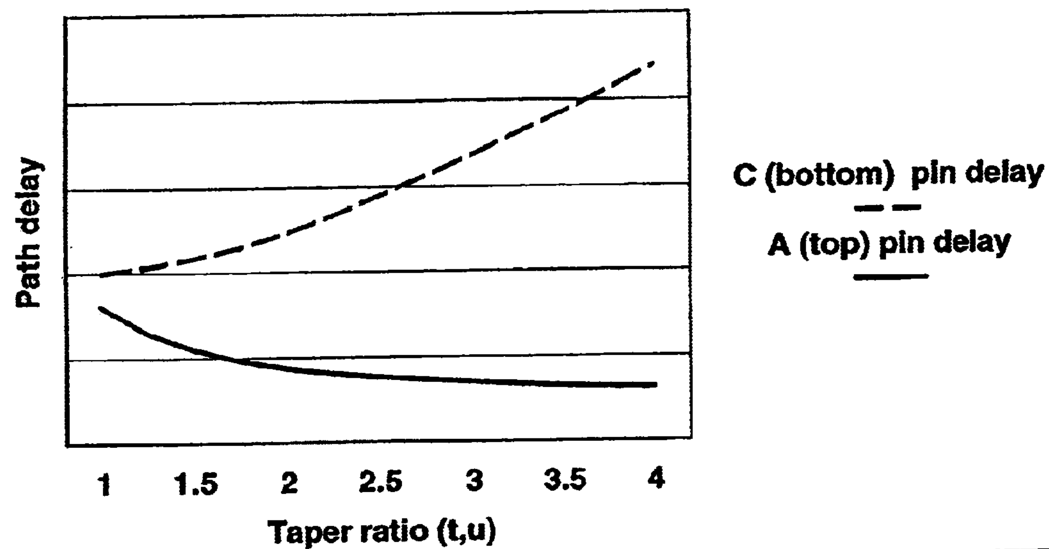
Fig. 5. 3-input NAND Path Delay
vs. Taper Ratio
Path delay
1
1.5
2
2.5
3
3.5
4
Taper ratio (t,u)
C (bottom) pin delay
A (top) pin delay

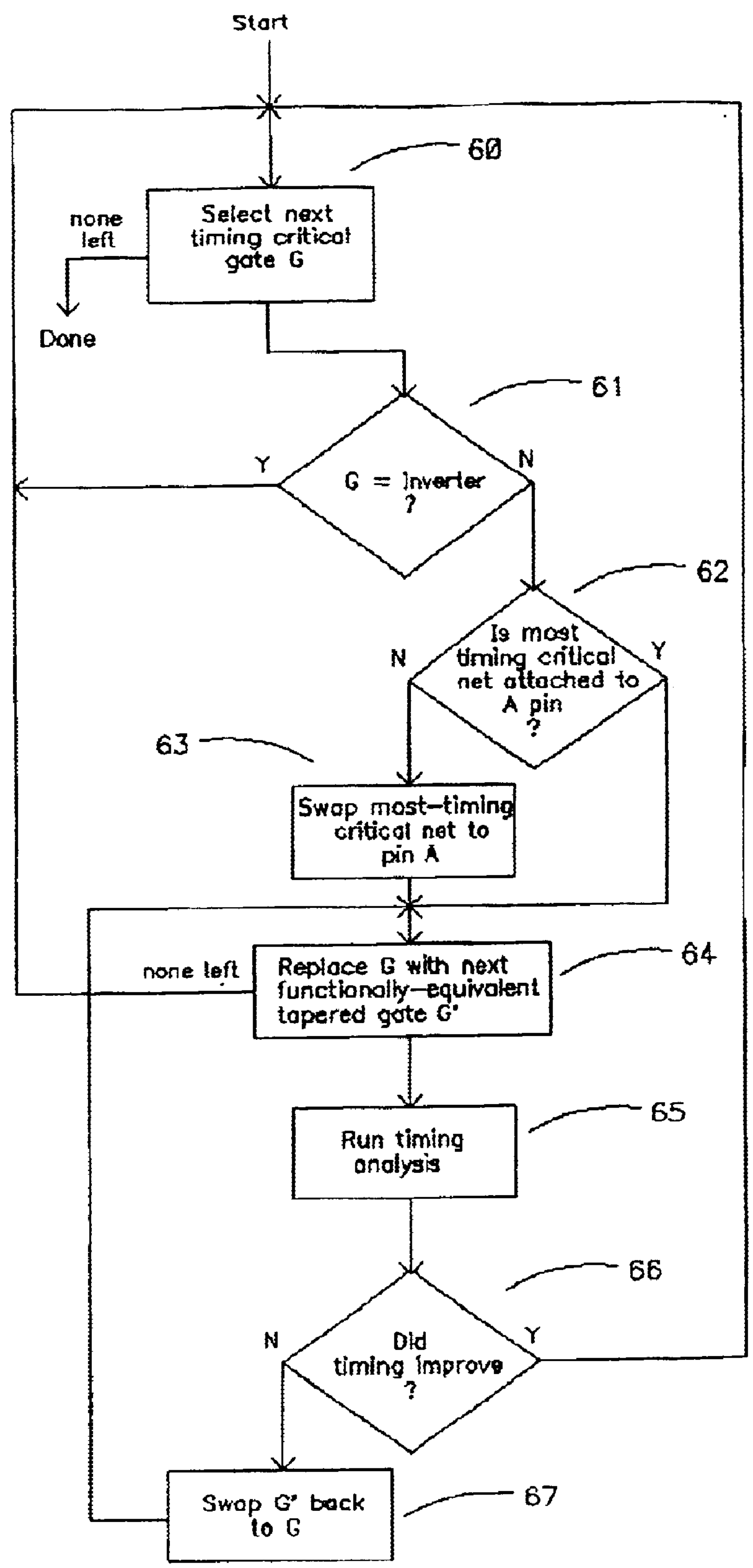
Fig 6. Synthesis tapered algorithm

CM OS TAPERED GATE AND SYNTHESIS METHOD

FIELD OF THE INVENTION

This invention relates to CMOS logic synthesis and in particular to logic synthesis in high-frequency CMOS designs.

BACKGROUND

It is common practice to specify the logic description of a CMOS design in a high-level language (such as Verilog or VHDL) and to synthesis this description into a circuit level implementation. Synthesis selects gates from a discrete gate library. It is especially common to synthesis random control logic to reduce the time to develop CMOS designs. Unfortunately synthesized circuit implementations are often slower than a non-synthesized (custom) circuit implementation and these synthesized control logic paths often limit the speed of high-frequency CMOS designs.

SUMMARY OF THE INVENTION

The disclosed tapered gate and synthesis methodology improves the quality of synthesized implementations. The critical path delays of these new implementations much closer to the delays of a custom circuit implementation. The discrete gate library is augmented with tapered gates to give synthesis more freedom in generation of a circuit implementation. In a tapered gate, the widths of the stacked devices are varied to achieve significant input pin to output pin delay differences. For example the bottom device(s) in a stack are designed with longer widths than the top device(s) to achieve smaller top input to output pin delay at the expense of larger bottom input to output pin delay. New synthesis algorithms are developed to exploit these tapered gates. Tapered and non-tapered gates are functionally equivalent—they differ in delay characteristics only. The input to output pin delay characteristics are coded in a rule. A timing analysis routine invokes these rules to compute arrival times and slacks (timing criticality) for each net in an implementation. A sorted, by timing criticality, list of nets is provided to the tapered gate synthesis algorithm.

The gate library from which gates are selected comprises a set of non-tapered gates and a set of tapered gates. The non-tapered gates are characterized by a stack of devices of the same width and the tapered gates are charactered by a stack of devices of different widths. Also, for each non-tapered gate there exists a plurality of tapered gates which are gunctionally equivalent to the non-tapered gate. Each set of tapered gates includes NAND gates, NOR gates, AND-OR-INVERT gates, and OR-AND-INVERT gates.

This algorithm modifies the input net to gate pin connections and swaps traditional non-tapered gates with tapered gates to improve the delay of the most timing critical paths. The latest arriving gate input net is swapped with the net connected to the top pin. The gate is then temporarily converted to a tapered gate and the timing analysis routine is invoked to re-compute arrival times and slacks for all nets. This tapered gate is retained if the slack of the temporary implementation is better than the slack of the original design.

These and other improvements are set forth in the following detailed description. For a better understanding of the invention with advantages and features, refer to the description and to the drawings.

DESCRIPTION OF THE DRAWINGS

FIG. 1 illustrates a non-tapered 3-input CMOS NAND gate.

FIG. 2 illustrates a tapered 3-input CMOS NAND gate.

FIG. 3 illustrates a non-tapered 2-input CMOS NOR gate.

FIG. 4 illustrates a tapered 2-input CMOS NOR gate.

FIG. 5 is a graph of the input to output delay characteristics of a tapered 3-input NAND gate.

FIG. 6 is a flow of the tapered gate synthesis algorithm in accordance with my preferred embodiment of the method.

My detailed description explains the preferred embodiments of my invention, together with advantages and features, by way of example with reference to the drawings.

DETAILED DESCRIPTION OF THE INVENTION

Any CMOS gate containing a stack of devices with height greater than one can be tapered. CMOS NAND gates contain a two or higher stack of NFET devices. CMOS NOR gates contain a two or higher stack of PFET devices and CMOS AIR and OAI gates contain (two or higher) stacks of both NFET devices and PFET devices. The only common CMOS gate which cannot be tapered is an inverter since it simply consists of a (1-high) NFET device stack and a (1-high) PFET device stack. A tapered gate is illustrated with a 3-input NAND and 2-input NOR.

FIG. 1 illustrates the devices comprising a non-tapered 3-input CMOS NAND gate. The PFET devices 10, 11 and 12, have same width, PW, and the NFET devices 13, 14, and 15, have same width, NW. It is common knowledge to those skilled in the art of CMOS design, that the widths of the devices comprising a gate determine the gates delay characteristics. In particular the beta ratio (PW/NW) determines the rising input and falling input delay characteristics.

FIG. 2 illustrates the devices comprising a tapered 3-input CMOS NAND gate. Note this tapered gate is functionally equivalent to the 3-input NAND in FIG. 1. The PFET devices 20, 21 and 22, have same width, PW, the NFET device 23 has width NW, the NFET device 24 has width t*NW and the NFET device 25 has width u*NW. The value of parameters t and u strongly influence the rising input delay characteristics of the gate. In particular consider the case where t and u are both greater than 1. The delay from rising top input pin A (26) to falling output node Y (29) is reduced since the bottom NFET devices 24 and 25 are wider compared to the non-tapered gate. The wider device widths effectively reduce the resistance of the NFET stack which speeds up the discharging of the output node 29 from Vdd to ground. But the path delay through input pin C (28) to output node Y (29) is increased. This is not obvious from a stand-alone analysis of this gate. But consider the gate which drives input pin C; the tapered gate with u>1 has larger input capacitance and this increases the delay of the gate driving input pin C. Thus, it is clear that the parameters t and u can be varied to change the input delay characteristics of the gate.

FIG. 3 illustrates the devices comprising a non-tapered 2-input CMOS NOR gate. The NFET devices 30 and 31 have same width, NW, and the PFET devices 33 and 34 have same width, PW. It is common knowledge to those skilled in the art of CMOS design, that the widths of the devices comprising a gate determine the gates delay characteristics. In particular the beta ratio (PW/NW) determines the rising input and falling input delay characteristics.

FIG. 4 illustrates the devices comprising a tapered 2-input CMOS NOR gate. Note this tapered gate is functionally equivalent to the 2-input NOR in FIG. 3. The NFET devices 40 and 41 have same width, NW, the PFET device 43 has width PW and the PFET device 44 has width t*PW. The value of parameter t strongly influences the falling input delay characteristics of the gate.

In particular consider the case where t is greater than 1. The delay from falling input pin A (46) to rising output node Y (49) is reduced since the top PFET device 44 is wider compared to the non-tapered gate. The wider device width effectively reduces the resistance of the PFET stack and speeds up the charging of the output node Y from ground to Vdd. But the path delay through input pin B (48) to output node Y (49) is increased. This is not obvious from a stand-alone analysis of this gate. But consider the gate which drives input pin B (48); the tapered gate with t>1 has larger input capacitance and this increases the delay of the gate driving input pin B. Thus, it is clear that the parameter t can be varied to change the input delay characteristics of the NOR gate.

Other types of CMOS gates may be tapered using the same methods just described for the 3-input NAND and 2-input NOR. These types of gates include (but are not limited to) CMOS NAND gates with 2 or 4 inputs, CMOS NOR gates with more than 2 inputs, and CMOS AND-OR-INVERT (AOI) and OR-AND-INVERT (OAI) gates with any number of inputs. CMOS AOI and OAI gates contain both a 2 or more high PFET stack and a 2 or more high NFET stack; therefore both the NFET and PFET stacks may be tapered for these gates.

FIG. 5 is a graph which illustrates how the path delay through 3-input NAND gate pins A and C varies as taper ratio parameters t and u are varied. Note that t=u=1 corresponds to the non-tapered gate. As the taper ratio is increased the delay through pin A (26) is reduced. However increasing taper ratio causes the delay through the pin C (28) to increase. (The delay characteristics of paths through 2-input NOR gate pins A and B as parameter t is varied in similar.) It is prohibitive to provide gates with a continuum of taper ratios t and u in a discrete gate library. From the graph, it can be observed that the majority of the delay improvement through pin A is obtained with t=2 or 3. Thus, only a few discrete values of t and u would be required in a tapered gate library. Also, parameters t and u needn't be equal; consider the tapered gate with t=1 and u>1. In this case the delay through pins A (26) and B (27) are reduced and the delay through pin C (28) is increased. Such a tapered gate would be useful to speed up the delay of two timing critical paths. Thus multiple functionally-equivalent tapered gates may exist for each type of non-tapered gate.

FIG. 6 is a flowchart of the synthesis algorithm which exploits the tapered gate library. The algorithm is invoked after an initial timing analysis. The timing analysis generates a list of timing critical gate instances. In algorithm step 60, the next gate instance, G, is selected from this list: if no critical timing instances remain the algorithm terminates. Otherwise G is examined to see if it is a candidate for tapering in step 61. If G is an inverter (which cannot be tapered) the algorithm returns to step 60 otherwise the timing criticality of the nets connected to the input of G are examined in step 62. If the most timing critical net, N, is not connected to pin A of G the algorithm swaps the net connected to pin A with net N (step 63). If net N is already connected to pin A no swapping is necessary. The algorithm then enters step 64 where G is replaced with the next functionally equivalent tapered gate G'. Timing analysis is invoked again in step 65 to re-compute the timing criticality of the paths through G', if timing is improved (step 66) then the tapered gate G' is retained and the algorithm returns to step 60. If timing is not improved G' is replaced with the original gate G (step 67) and the algorithm returns to step 64. If all functionally equivalent tapered gates have been evaluated (step 64) the algorithm returns to step 60.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A logic synthesis method for reducing the delay of a timing critical path in a circuit, comprising the steps of:

(a) selecting a gate which is not an inverter in the timing critical path;

(b) swapping said timing critical path to a pin of said gate;

(c) replacing said gate with a functionally equivalent tapered gate;

(d) performing a timing analysis of said circuit; and (e) if said timing analysis of said circuit indicates improvement in a worst case delay through said circuit;

(f) then retaining said tapered gate; and (g) if said timing analysis of said circuit indicates no improvement in said worst case delay through said circuit;

(h) then swapping said tapered gate back to said selected gate for use in said circuit.

2. The logic synthesis method of claim 1, wherein said gate is selected from a gate library comprising a set of non-tapered gates and a set of tapered gates, and wherein in said gate library, said non-tapered gates are characterized by a stack of devices of the same width and said tapered gates are characterized by a stack of devices of different widths.

3. The logic synthesis method of claim 1, wherein said gate is selected from a gate library comprising a set of non-tapered gates and a set of tapered gates, and wherein each set in said gate library comprises one or more of the following gates: NAND gates, NOR gates, AND-OR-INVERT gates, and OR-AND-INVERT gates.

4. The logic synthesis method as in claim 3, whereby the delay through said tapered gate and the delay through said non-tapered gate are compared.

5. The logic synthesis method as in claim 1, whereby a plurality of tapered gates exist for a non-tapered gate, said plurality of tapered gates being functionally equivalent to said non-tapered gate.

6. The logic synthesis method as in claim 5, whereby the selection of said plurality of tapered gates available for use in said circuit is swapped into said circuit for comparison with a timing analysis of the circuit.

7. The logic synthesis method as in claim 6, whereby the delay through said plurality of tapered gates and the delay through said non-tapered gate are compared.

8. The logic synthesis method as in claim 7, whereby the gate of said plurality of gates which yields the shortest delay is the one retained for said circuit.

* * * * *